United States Patent
Sato et al.

(10) Patent No.: US 10,236,862 B2
(45) Date of Patent: Mar. 19, 2019

(54) DUPLEXER DEVICE

(71) Applicant: WISOL JAPAN CO., LTD., Kawasaki-shi, Kanagawa (JP)

(72) Inventors: Takahiro Sato, Kawasaki (JP); Kensei Uehara, Kawasaki (JP); Motoyuki Tajima, Kawasaki (JP)

(73) Assignee: WISOL JAPAN CO, LTD., Kawasaki-Shi, Kanagawa (JP)

( * ) Notice: Subject to any disclaimer, the term of this patent is extended or adjusted under 35 U.S.C. 154(b) by 153 days.

(21) Appl. No.: 15/364,406

(22) Filed: Nov. 30, 2016

(65) Prior Publication Data

US 2017/0163244 A1 Jun. 8, 2017

(30) Foreign Application Priority Data

Dec. 7, 2015 (KR) .................. 10-2015-0173324

(51) Int. Cl.
*H03H 9/72* (2006.01)
*H03H 9/64* (2006.01)
(Continued)

(52) U.S. Cl.
CPC ........... *H03H 9/725* (2013.01); *H01P 1/2002* (2013.01); *H03H 9/02559* (2013.01);
(Continued)

(58) Field of Classification Search
CPC ...... H03H 7/46; H03H 7/465; H03H 9/02559; H03H 9/6406; H03H 9/6409;
(Continued)

(56) References Cited

U.S. PATENT DOCUMENTS 5,473,295 A * 12/1995 Turunen .................. H04B 1/50
  333/132
5,894,251 A *  4/1999 Taguchi ............... H03H 9/6483
  310/313 B (Continued)

FOREIGN PATENT DOCUMENTS

JP   01-200726   *  8/1989
JP   2002-171315  *  6/2002  ........... H04B 1/0003
(Continued)

OTHER PUBLICATIONS

English language machine translation of JP 01-200726, published Aug. 11, 1989, 2 pages.*

(Continued)

*Primary Examiner* — Barbara Summons
(74) *Attorney, Agent, or Firm* — LRK Patent Lawfirm

(57) ABSTRACT

A problem is improved in which a plurality of duplexers has to be used if at least one of a transmission band and reception band for a handheld terminal partially overlaps a frequency band used in another communication system. A duplexer device includes a duplexer configured to include an antenna terminal, a transmission terminal and a reception terminal and to have a specific transmission band and reception band and a band-stop filter connected to at least one of the antenna terminal, the transmission terminal and the reception terminal via a switch and configured to suppress some of at least one of the specific transmission band and reception band in response to the switching of the switch.

7 Claims, 6 Drawing Sheets

(51) Int. Cl.
*H04B 1/10* (2006.01)
*H04L 5/14* (2006.01)
*H01P 1/20* (2006.01)
*H03H 9/02* (2006.01)
*H01P 5/19* (2006.01)

(52) U.S. Cl.
CPC ........ *H03H 9/6406* (2013.01); *H03H 9/6409* (2013.01); *H03H 9/6423* (2013.01); *H04B 1/1036* (2013.01); *H04L 5/14* (2013.01); *H01P 5/19* (2013.01)

(58) Field of Classification Search
CPC .... H03H 9/6423; H03H 9/725; H01P 1/2002; H01P 5/12; H01P 5/19; H01L 5/14; H04B 1/0053; H04B 1/10; H04B 1/1036; H04B 2001/1063
USPC ............... 333/101, 129, 132, 133, 134, 135; 455/78, 552.1
See application file for complete search history.

(56) References Cited

U.S. PATENT DOCUMENTS

| | | | | |
|---|---|---|---|---|
| 6,115,592 | A * | 9/2000 | Ueda | H03H 9/0576 455/303 |
| 6,809,611 | B2 * | 10/2004 | Ishizaki | H01P 1/213 333/133 |
| 6,833,774 | B2 * | 12/2004 | Abbott | H03H 9/6483 310/313 A |
| 7,298,231 | B2 * | 11/2007 | Ikuta | H03H 9/725 333/133 |
| 2002/0081987 | A1 * | 6/2002 | Yoshida | H04B 1/0003 455/277.1 |
| 2002/0186757 | A1 * | 12/2002 | Nakamura | H04B 1/0057 375/219 |
| 2005/0215204 | A1 * | 9/2005 | Wallace | H04B 1/1036 455/78 |
| 2007/0191055 | A1 * | 8/2007 | Kovacs | H04B 1/18 455/552.1 |
| 2009/0054008 | A1 * | 2/2009 | Satou | H04B 1/406 455/78 |
| 2012/0231751 | A1 * | 9/2012 | Oka | H04B 1/0053 455/78 |
| 2014/0177748 | A1 * | 6/2014 | Malaga | H04B 1/0014 375/267 |
| 2015/0235971 | A1 * | 8/2015 | Smith | H01L 23/66 333/174 |
| 2015/0236798 | A1 * | 8/2015 | Nobbe | H04B 17/12 370/278 |

FOREIGN PATENT DOCUMENTS

JP 2010-136298 * 6/2010
SU 1111256 * 8/1984

OTHER PUBLICATIONS

English language machine translation of JP 2010-136298, published Jun. 17, 2010, 9 pages.*

* cited by examiner

DUPLEXER DEVICE

CROSS REFERENCE TO RELATED APPLICATION

The present application claims the benefit of Korean Patent Application No. 10-2015-0173324, filed in the Korean Intellectual Property Office on Dec. 7, 2015, the entire content of which is incorporated herein by reference.

BACKGROUND OF THE INVENTION

1. Technical Field

The present invention relates to a duplexer device.

2. Description of Related Art

A duplexer including a surface acoustic wave (SAW) device is mounted on a communication device, such as a handheld terminal, in order to electrically separate the transmission path and reception path of an antenna.

Different frequency bands are allocated to communication devices depending on areas and countries. In order to use the same communication device in several areas and countries, a plurality of duplexers corresponding to many bands needs to be mounted on the communication device. Furthermore, as the number of bands used for communication recently increases, the pass band of a duplexer partially overlaps a frequency band used in another communication system, such as a television signal, in some countries. An example in which the pass band of a duplexer partially overlaps a frequency band used in another communication system is described in more detail below with reference to FIG. 7.

FIG. 7 shows the transmission band 61 and reception band 62 of a duplexer and shows that a band on the low frequency side of the transmission band 61 partially overlaps another band 63 used in another communication system, for example, a television system. In FIG. 7, a horizontal axis is a frequency MHz and a vertical axis is an insertion loss dB.

The transmission band 61 is divided into a block-A including a frequency band overlapping another band 63 and a block-B including a frequency band not overlapping another band 63. A band in which the block-A and the block-B overlap is used as a real transmission band. Likewise, the reception band 62 is divided into a block-A and block-B corresponding to the transmission band 61. A band in which the block-A and the block-B overlap is used as a real reception band.

As shown in FIG. 7, if some of the transmission band 61 overlaps another band 63 and another band 63 is used, a stop band 64 has to be formed in the block-A included in the low frequency region of a real transmission band. Although some of the transmission band 61 overlaps another band 63, it is necessary to handle a case where another band 63 is not used.

For this reason, there is a need to prepare a duplexer designed to stop a stop region and transmit a real transmission band and a real reception band and a duplexer designed to transmit a stop region and also transmit a real transmission band and a real reception band. However, if a plurality of duplexers having different filter characteristics is installed, it becomes an obstacle to a reduction in the size of a handheld terminal. Furthermore, cross wires become complicated because a switch for switching two duplexers is also required.

SUMMARY OF THE INVENTION

An object of the present invention is to provide a duplexer device, which is capable of easily suppressing a signal in a pass band although some of the pass band of a duplexer overlaps a frequency band used in another communication system.

In an aspect of the present invention, a duplexer device includes a duplexer configured to include an antenna terminal, a transmission terminal and a reception terminal and to have a specific transmission band and reception band and a band-stop filter connected to at least one of the antenna terminal, the transmission terminal and the reception terminal via a switch and configured to suppress some of at least one of the specific transmission band and reception band in response to the switching of the switch.

DETAILED DESCRIPTION

Figure 1:
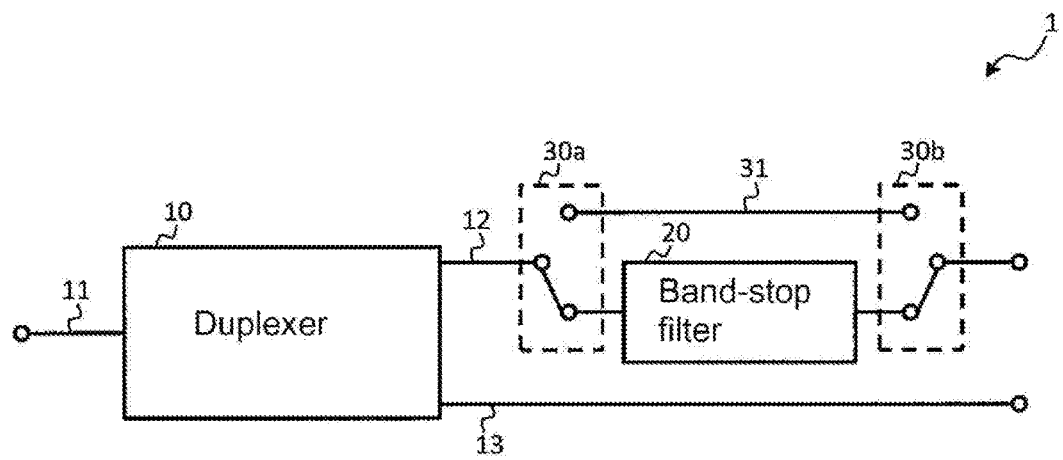
FIG. 1 is a block diagram showing the configuration of a duplexer device related to a first embodiment of the present invention.

Exemplary embodiments of the present invention are described in detail below with reference to the accompanying drawings. Furthermore, in order to avoid inconvenience attributable to a redundant description, the same reference numeral is assigned to the same part or an equivalent thereof in each figure and a description thereof is omitted.

First Embodiment

Figure 2:
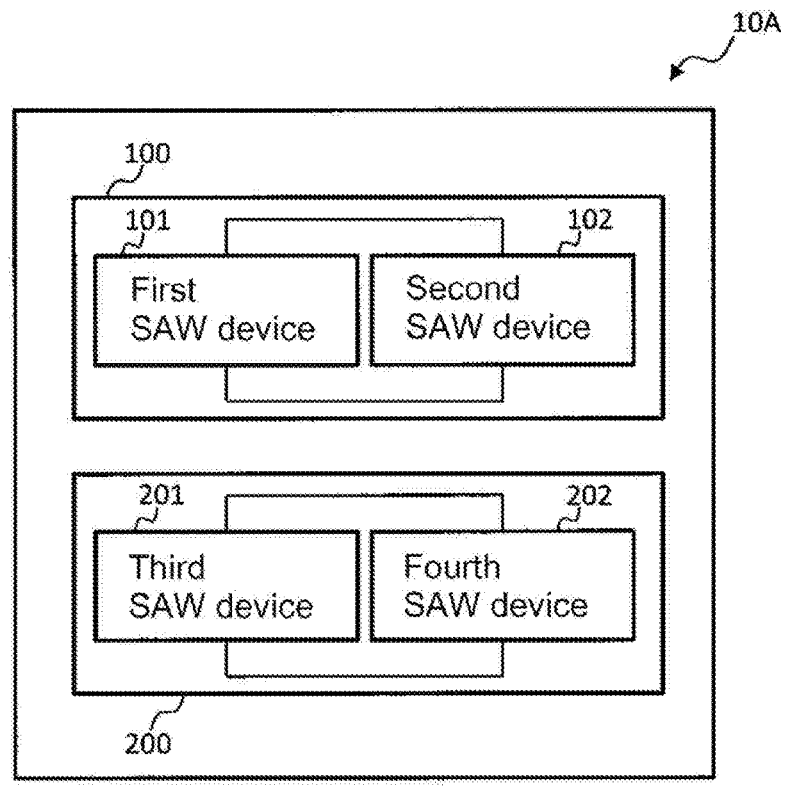
FIG. 2 is a block diagram showing an example of a duplexer related to an embodiment of the present invention.

FIG. 1 is a block diagram showing the configuration of a duplexer device related to a first embodiment of the present invention. FIG. 2 is a block diagram showing an example of a duplexer related to an embodiment of the present invention.

Referring to FIG. 1, the duplexer device 1 includes a duplexer 10, a band-stop filter 20, a switch 30a and a switch 30b. In FIG. 1, the duplexer device 1 has been illustrated as being formed by a SAW device mounted on a piezoelectric device.

The illustrated duplexer 10 further includes an antenna terminal 11, a transmission terminal 12 and a reception terminal 13. The antenna terminal 11 is a terminal connected to the antenna of a communication device on which the duplexer 10 is mounted. The transmission terminal 12 is a terminal connected to the transmission circuit of a communication device on which the duplexer 10 is mounted. The reception terminal 13 is a terminal connected to the reception circuit of a communication device on which the duplexer 10 is mounted.

In an embodiment of the present invention, the duplexer 10 may be a duplexer corresponding to a full band having the transmission band and reception band of a broad band in order to handle several frequency bands. Such a duplexer 10 may be formed of a piezoelectric substrate having an electromechanical coupling constant $k^2$ of 11% or more, for example. The piezoelectric substrate having an electromechanical coupling constant of 11% or more may be formed by combining a thin film made of silicon dioxide ($SiO_2$) and a substrate made of lithium niobate ($LiNbO_3$), for example.

FIG. 2 is a schematic diagram showing an example of the configuration of a duplexer according to an embodiment of the present invention. As shown in FIG. 2, the duplexer 10A includes a transmission filter 100 and a reception filter 200. Furthermore, the duplexer of FIG. 2 has the same configuration as the duplexer disclosed in Korean Patent Application No. 10-2015-0078784 applied by the present inventors prior to the present invention. The contents of the aforementioned specification are incorporated into this specification.

The transmission filter 100 includes a first SAW device 101 and a second SAW device 102.

Each of the first SAW device 101 and the second SAW device 102 includes a common bandpass filter that transmits only the signal of a specific frequency band, and they have an input terminal and an output terminal connected in common. Furthermore, the first SAW device 101 has a pass band in a low frequency band compared to the second SAW device 102. Furthermore, the first SAW device 101 and the second SAW device 102 have the pass band of substantially the same width, and each has a steep attenuation characteristic on the low frequency side and high frequency side of the pass band.

In this case, assuming that the real part of the reflection coefficient of the first SAW device 101 is a1, the imaginary part of the reflection coefficient of the first SAW device 101 is b1, the real part of the reflection coefficient of the second SAW device 102 is a2 and the imaginary part of the reflection coefficient of the second SAW device 102 is b2, the input terminal and the output terminal have relationships a1≥a2 and b1>b2. Furthermore, the pass bands of the first SAW device 101 and the second SAW device 102 are intersected in a region about 3 dB attenuated from the value of an insertion loss in each center frequency. Furthermore, the first SAW device 101 and the second SAW device 102 are not especially limited to the above configurations, and may have a double mode type or a ladder type.

The reception filter 200 includes a third SAW device 201 and a fourth SAW device 202. Each of the third SAW device 201 and the fourth SAW device 202 includes a common bandpass filter that transmits only the signal of a specific frequency band, and they have an input terminal and an output terminal connected in common. Furthermore, the third SAW device 201 has a pass band in a low frequency band compared to the fourth SAW device 202. Furthermore, the third SAW device 201 and the fourth SAW device 202 have the pass band of substantially the same width, and each has a steep attenuation characteristic on the low frequency side and high frequency side of the pass band.

In this case, assuming that the real part of the reflection coefficient of the third SAW device 201 is a3, the imaginary part of the reflection coefficient is b3, the real part of the reflection coefficient of the fourth SAW device 202 is a4 and the imaginary part of the reflection coefficient of the fourth SAW device 202 is b4, the input terminal and the output terminal have relationships a3≥a4 and b3>b4. Furthermore, the pass bands of the third SAW device 201 and the fourth SAW device 202 are intersected in a region about 3 dB attenuated from the value of an insertion loss in each center frequency. Furthermore, the third SAW device 201 and the fourth SAW device 202 are not especially limited to the above configurations, and may have a double mode type or a ladder type.

Referring back to FIG. 1, the band-stop filter 20 connected to the duplexer 10 is a filter capable of suppressing only the signal of a specific frequency band. Specifically, the band-stop filter 20 can suppress the signal of a frequency band included in an overlap range if another band used in another communication system overlaps the transmission band and reception band of the duplexer 10. Such a band-stop filter 20 may be formed of a SAW filter or a dielectric filter, for example, but may be a SAW filter using the same substrate as the duplexer 10. If the band-stop filter 20 is configured using the SAW filter, it may be configured by connecting a plurality of resonators in multiple stages and has only to have an attenuation characteristic of 15~20 dB.

Furthermore, the band-stop filter 20 is connected to the duplexer 10 with the switch 30a and the switch 30b interposed therebetween.

In the duplexer device 1, the duplexer 10 is connected to the band-stop filter 20 or the transmission wire 31 by switching the switch 30a and the switch 30b.

Figure 7:
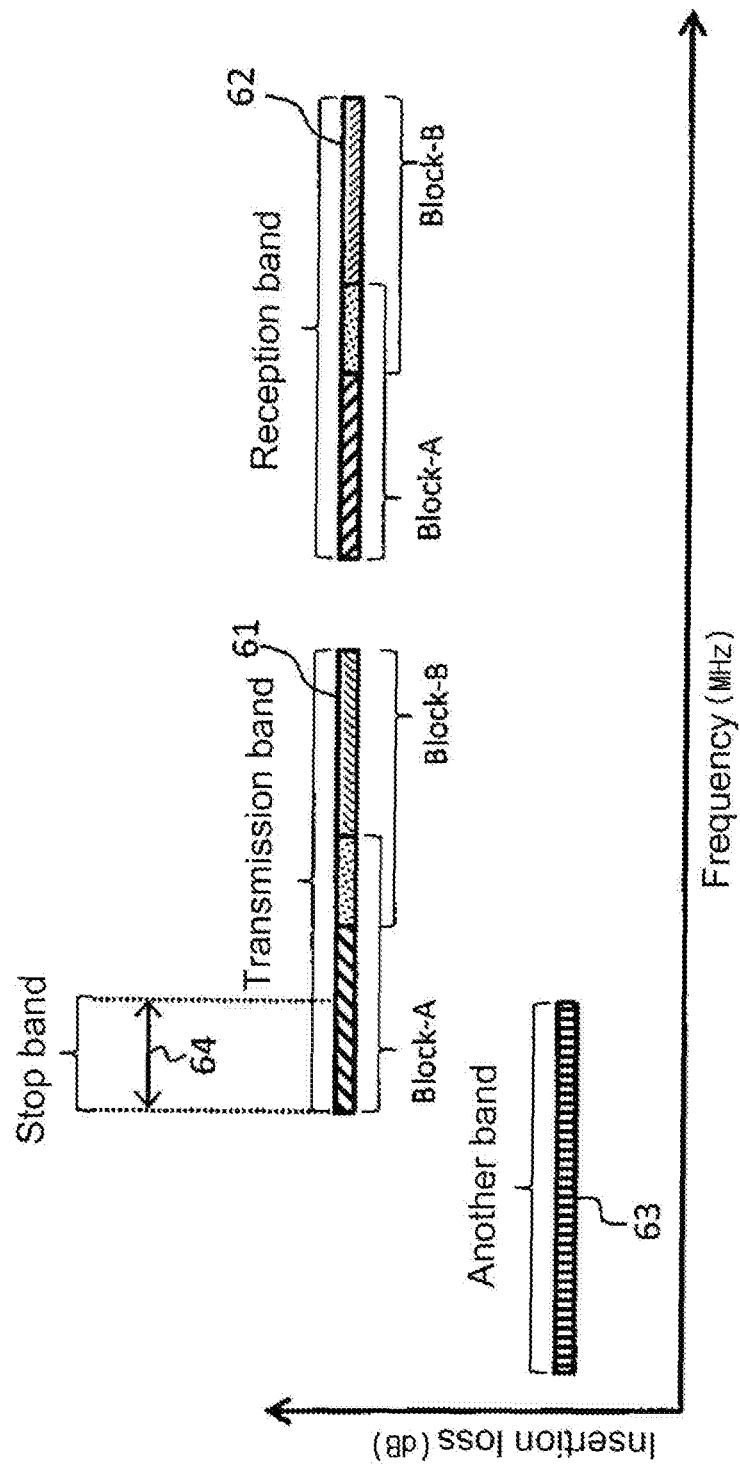
FIG. 7 is a diagram illustrating a case where a transmission band and a reception band and the frequency band of another communication system partially overlap.

In this case, each of the switches 30a and, 30b may be configured to switch in response to a frequency switching signal generated upon roaming operation. When the duplexer 10 is connected to the band-stop filter 20, the signal of a specific frequency band (e.g., the stop band of FIG. 7) is suppressed. When another duplexer 10 is connected to a transmission wire 31, a signal output by a transmission circuit, such as a communication device, is transmitted to an external circuit, for example, a transmission circuit without the intervention of the band-stop filter 20.

Accordingly, if it is previously known that a signal used in another communication system overlaps the transmission band and reception band of the duplexer 10, a frequency switching signal according to a corresponding communication system is output to the duplexer 10, and the duplexer 10 has only to be connected to the band-stop filter 20. If it is previously known that a signal used in another communication system is not present in the transmission band and reception band of the duplexer 10, the duplexer 10 has only to be connected to the transmission wire 31.

Figure 3:
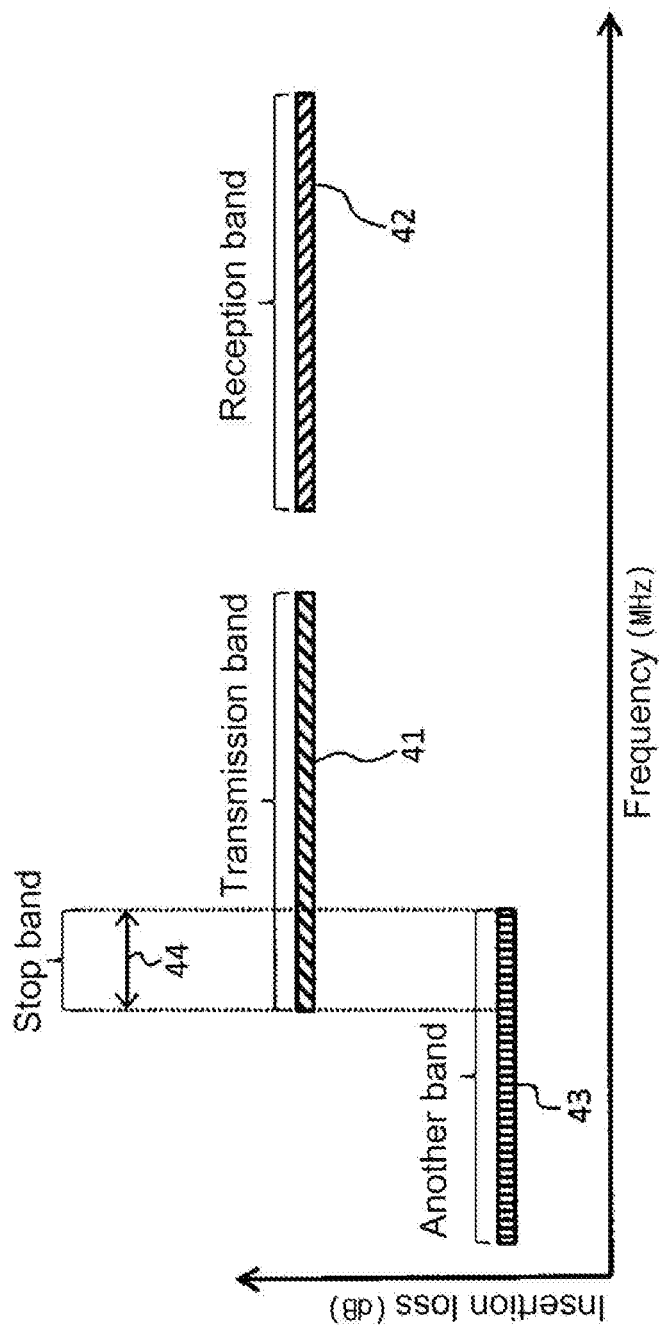
FIG. 3 is a schematic diagram showing relations between a transmission band, a reception band and a stop band.

FIG. 3 is a schematic diagram showing relations between the transmission band, reception band and stop band of the duplexer 10, which are related to an embodiment of the present invention. FIG. 3 shows a transmission band 41, a reception band 42, another band 43 and a stop band 44. In FIG. 3, a horizontal axis is a frequency MHz and a vertical axis is an insertion loss dB.

The transmission band 41 and the reception band 42 denote the transmission band and reception band of the duplexer 10, respectively. Furthermore, in an embodiment of the present invention, the frequency bands of the transmission band 41 and the reception band 42 are not especially limited, but may be set as several frequency bands.

Another band 43 indicates a frequency band used in a communication system different from a communication device on which the duplexer 10 has been mounted, for example.

The stop band 44 indicates a frequency band in which the transmission band 41 and another band 43 overlap. For this reason, if another band 43 is used, the stop band 44 needs to be suppressed in order to avoid interference with another communication system although it is included in the transmission band 41.

Figure 4:
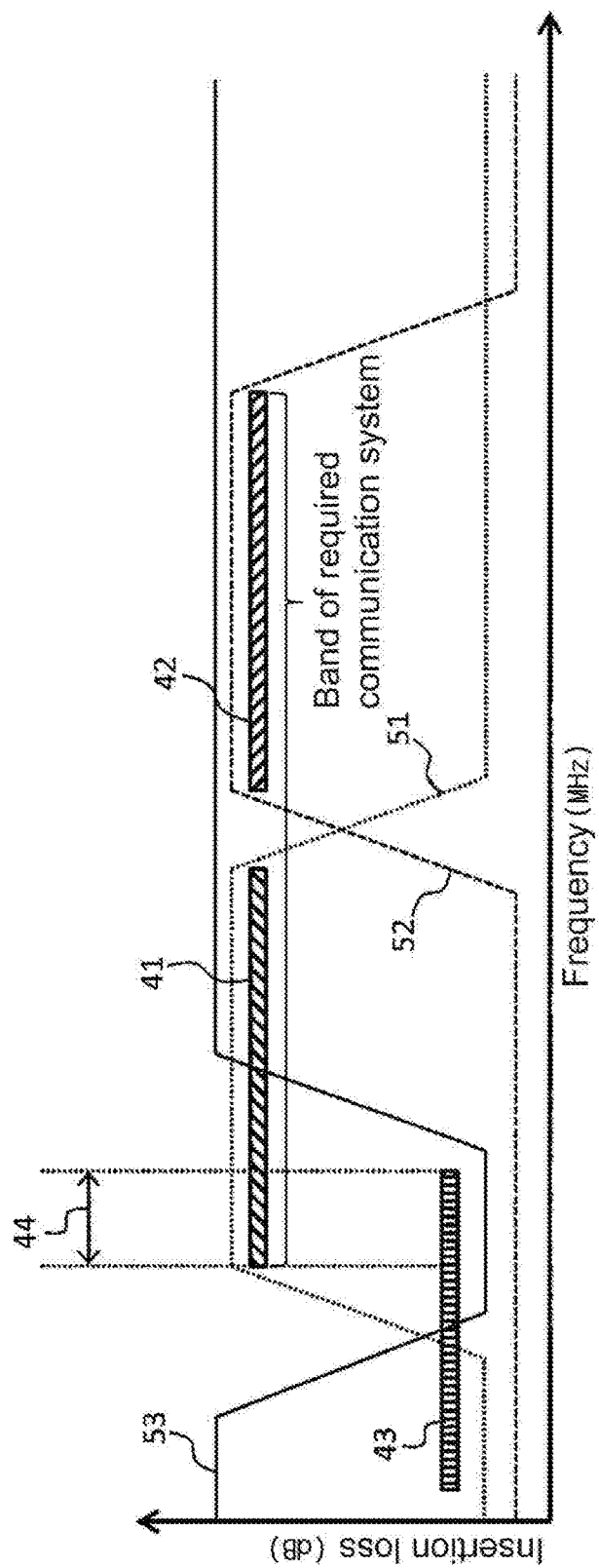
FIG. 4 is a schematic diagram showing relations between a transmission characteristic, a reception characteristic and a stop characteristic.

FIG. 4 is a schematic diagram showing the transmission characteristic and reception characteristic of the duplexer 10 and the stop characteristic of the band-stop filter 20, which are related to an embodiment of the present invention. In FIG. 4, a horizontal axis is a frequency MHz and a vertical axis is an insertion loss dB.

A transmission characteristic 51 indicates a frequency characteristic on the reception side of the duplexer 10. A reception characteristic 52 indicates a frequency characteristic on the reception side of the duplexer 10. A stop characteristic 53 indicates the frequency characteristic of the band-stop filter 20.

As shown in FIG. 4, the stop characteristic 53 has a steep attenuation characteristic in a stop band 44, that is, a frequency band in which the transmission band 41 and another band 43 overlap. That is, the stop band 44 included in the transmission band 41 can be suppressed by connecting the band-stop filter 20 having the stop characteristic 53, such as that shown in FIG. 4, to the transmission terminal 12 of the duplexer 10.

Specifically, the band-stop filter 20 is connected to the transmission terminal 12 of the duplexer 10 with the switch 30a and the switch 30b interposed therebetween. In this case, a signal output by a transmission circuit, such as a communication device, is applied to the duplexer 10, and is then output to an external circuit via the band-stop filter 20. For this reason, the band-stop filter 20 can suppress the stop band 44 included in the transmission band 41 of the duplexer 10. Furthermore, as described above, the duplexer 10 may be a duplexer having a full band that is a combined frequency band of the transmission band 41 and the reception band 42 and that corresponds to the band of a required communication system.

Furthermore, in FIG. 4, only the one stop band 44 has been illustrated, but this is only illustrative. A plurality of stop bands may be present. In this case, a plurality of stop bands 44 can be suppressed by preparing a plurality of band-stop filters 20 corresponding to the stop bands 44 and connecting the plurality of band-stop filters 20 to the transmission terminal 12 of the duplexer 10.

Furthermore, an example in which the band-stop filter 20 is connected to the transmission terminal 12 of the duplexer 10 has been illustrated, but the band-stop filter 20 may be connected to the antenna terminal 11 and reception terminal 13 of the duplexer 10 other than the transmission terminal 12.

If the band-stop filter 20 is connected to the antenna terminal 11 of the duplexer 10, a signal from an antenna is directly inputted to the band-stop filter 20, and a signal whose stop band has been suppressed by the band-stop filter 20 is supplied to the duplexer 10. In this case, the band-stop filter 20 can suppress the stop band 44 if the stop band 44 is included in the transmission band 41 and reception band 42 of the duplexer 10.

Furthermore, if the band-stop filter 20 is connected to the reception terminal 13 of the duplexer 10, a signal inputted to the duplexer 10 is supplied to a reception circuit, such as a communication device, via the band-stop filter 20. In this case, the band-stop filter 20 can suppress the stop band 44 if the stop band 44 is included in the reception band 42 of the duplexer 10.

That is, the band-stop filter 20 is selectively connected to the antenna terminal 11, the transmission terminal 12 or the reception terminal 13 depending on a frequency band of the stop band 44, thus being capable of suppressing the stop band 44.

Second Embodiment

Figure 5:
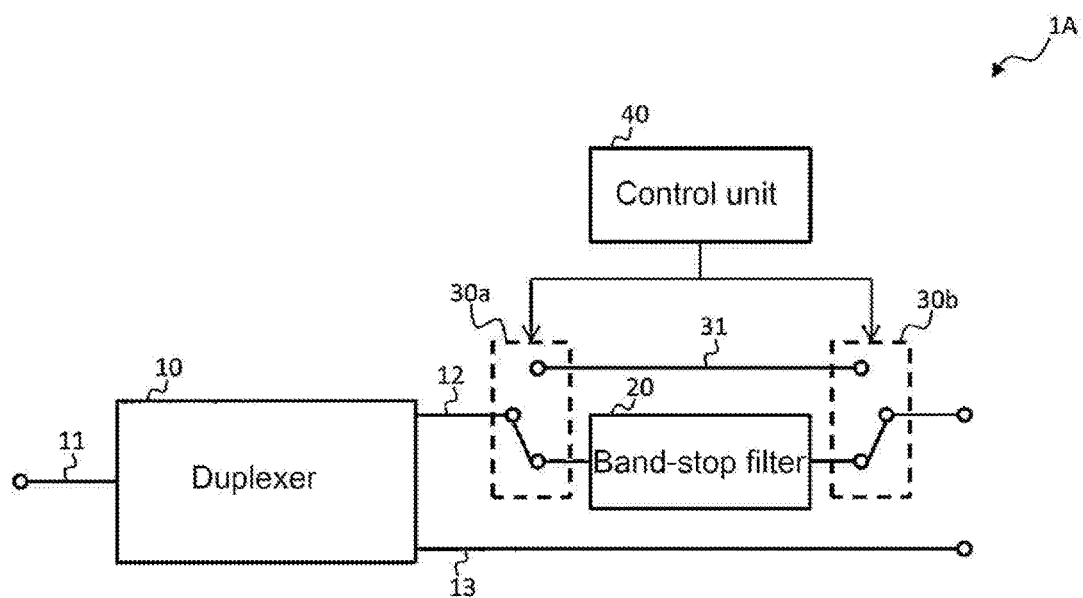
FIG. 5 is a block diagram showing the configuration of a duplexer device related to a second embodiment of the present invention.

FIG. 5 is a block diagram showing the configuration of a duplexer device 1A related to a second embodiment of the present invention. It is assumed that the illustrated duplexer device 1A can freely switch switches 30a and 30b.

The duplexer device 1A includes a duplexer 10, a band-stop filter 20, the switch 30a, the switch 30b and a control unit 40.

The control unit 40 is electrically connected to the switch 30a and the switch 30b. Furthermore, the control unit 40 is connected to a frequency detection circuit (not shown), and outputs a switching signal to the switch 30a or 30b in response to output from a corresponding frequency detection circuit. Accordingly, the duplexer 10 can switch the switch 30a or the switch 30b in response to a detected frequency band. Specifically, the control unit 40 detects whether another band is present in a frequency band that overlaps the transmission band and reception band of the duplexer 10. If, as a result of the detection, another band is found to be present, the control unit 40 switches the switch 30a or the switch 30b by a switching signal and connects the duplexer 10 and the band-stop filter 20. If, as a result of the detection, another band is found to be not present, the control unit 40 directly connects the duplexer 10 and the transmission wire 31 by controlling the switch 30a and the switch 30b without connecting the duplexer 10 and the band-stop filter 20. In this case, the control unit 40 may be configured to detect a corresponding frequency band by being integrated with a roaming circuit, for example.

Figure 6:
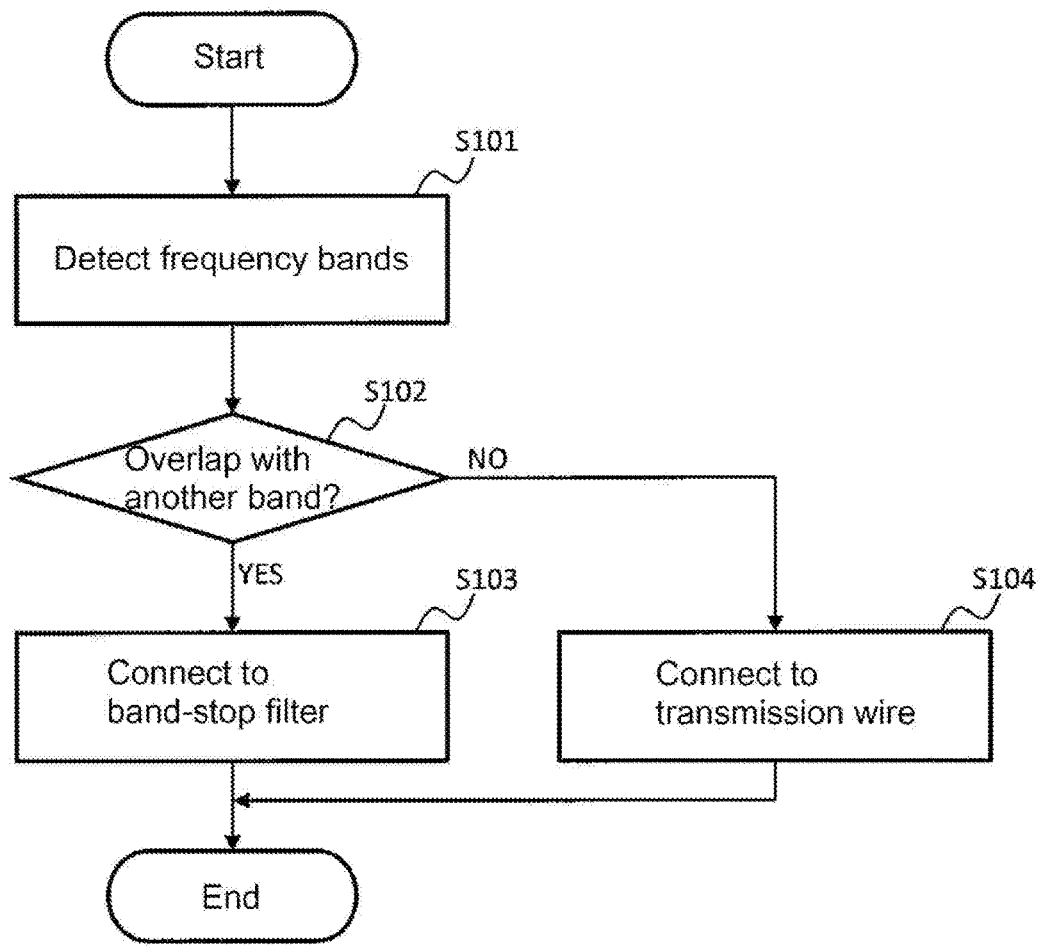
FIG. 6 is a flowchart illustrating an operation of a control unit related to the second embodiment of the present invention.

FIG. 6 is a flowchart illustrating a flow of an operation for detecting, by the control unit 40 of FIG. 5, a band used in a communication device and switching the switch 30a and the switch 30b.

First, the control unit 40 detects the transmission band of the duplexer 10 used in a communication device and another frequency band at step S101.

If the control unit 40 detects that another frequency band is present in a frequency band overlapping the transmission band of the duplexer 10 (「YES」 at step S102), it connects the duplexer 10 and the band-stop filter 20 by switching the switch 30a and the switch 30b at step S103. Accordingly, a frequency band in which the transmission band of the duplexer 10 overlaps another frequency band can be suppressed.

If, as a result of the detection, another frequency band is found to be not present in the frequency band overlapping the transmission band (「NO」 at step S102), the control unit 40 connects the duplexer 10 and the transmission wire 31 by switching the switch 30a and the switch 30b at step S104.

A method for controlling, by the control unit 40, the switch 30a and the switch 30b if the band-stop filter 20 is connected to the transmission terminal 12 of the duplexer 10 has been described above, but this is only illustrative and the present invention is not limited thereto. The control unit 40 may perform the same control operation although the band-stop filter 20 is connected to the antenna terminal 11 or reception terminal 13 of the duplexer 10. Furthermore, the control unit 40 may perform the same control operation although a plurality of the band-stop filters 20 is connected to the antenna terminal 11, transmission terminal 12 and reception terminal 13 of the duplexer 10.

In accordance with an embodiment of the present invention, a signal within a pass band can be easily suppressed although some of the pass band of the duplexer overlaps a frequency band used in another communication system.

What is claimed is:

1. A duplexer device comprising:
a duplexer configured to comprise an antenna terminal, a transmission terminal and a reception terminal and to have a specific transmission band and reception band; and
a band-stop filter connected to at least one of the antenna terminal, the transmission terminal and the reception terminal via a switch and configured to suppress some of at least one of the specific transmission band and reception band in response to a switching of the switch, wherein:
the duplexer comprises a first surface acoustic wave (SAW) device and a second SAW device,
an input terminal and output terminal of the first SAW device and the second SAW device are common,
the first SAW device has a lower pass band than the second SAW device, and
a frequency on a high frequency side of a first pass band of the first SAW device partially overlaps a frequency on a low frequency side of a second pass band of the second SAW device.

2. The duplexer device of claim 1, wherein:
the band-stop filter suppresses a third band which partially overlaps at least one of the transmission band and the reception band, and
the third band is a frequency band which is used in a communication system different from a communication device on which the duplexer has been mounted.

3. The duplexer device of claim 2, further comprising a control unit configured to control the switching of the switch.

4. The duplexer device of claim 3, wherein the control unit switches the switch in response to the third band.

5. The duplexer device of claim 1, wherein the duplexer comprises a piezoelectric substrate having an electromechanical coupling constant of 11% or more.

6. The duplexer device of claim 5, wherein the piezoelectric substrate is made of a material comprising $LiNbO_3$.

7. The duplexer device of claim 1, wherein the band-stop filter comprises a SAW filter or a dielectric filter.

* * * * *